United States Patent
Nomura

(10) Patent No.: US 7,199,490 B2
(45) Date of Patent: Apr. 3, 2007

(54) SEMICONDUCTOR DEVICE FOR PREVENTING NOISE GENERATION

(75) Inventor: Masahiro Nomura, Tokyo (JP)

(73) Assignee: NEC Corporation, Minato-ku, Tokyo (JP)

( * ) Notice: Subject to any disclaimer, the term of this patent is extended or adjusted under 35 U.S.C. 154(b) by 257 days.

(21) Appl. No.: 10/311,525

(22) PCT Filed: Jun. 13, 2001

(86) PCT No.: PCT/JP01/05021

§ 371 (c)(1),
(2), (4) Date: Jun. 20, 2003

(87) PCT Pub. No.: WO01/97288

PCT Pub. Date: Dec. 20, 2001

(65) Prior Publication Data

US 2004/0004400 A1    Jan. 8, 2004

(30) Foreign Application Priority Data

Jun. 14, 2000    (JP) .............................. 2000-177809

(51) Int. Cl.
*H01H 35/00*    (2006.01)
*H01H 33/59*    (2006.01)
*H01H 85/46*    (2006.01)
*G05F 1/613*    (2006.01)

(52) U.S. Cl. ...................... 307/115; 307/116; 307/112; 323/223

(58) Field of Classification Search ................ 307/109, 307/112, 114, 116, 110, 115, 130; 320/116; 323/223

See application file for complete search history.

(56) References Cited

U.S. PATENT DOCUMENTS

| | | | | |
|---|---|---|---|---|
| 4,937,538 | A * | 6/1990 | Hovens | 331/17 |
| 5,444,310 | A * | 8/1995 | Kataoka et al. | 307/125 |
| 5,844,263 | A * | 12/1998 | Asai et al. | 257/208 |
| 6,057,729 | A * | 5/2000 | Nomura | 327/592 |
| 6,365,914 | B1 * | 4/2002 | Yamadate | 257/48 |
| 6,605,929 | B2 * | 8/2003 | Tsukagoshi et al. | 323/223 |
| 6,788,039 | B2 * | 9/2004 | Abdoulin | 323/288 |
| 2002/0036515 | A1 * | 3/2002 | Eldridge et al. | 324/765 |

FOREIGN PATENT DOCUMENTS

| | | |
|---|---|---|
| JP | 60-48525 | 3/1985 |
| JP | 6-29834 | 2/1994 |

* cited by examiner

*Primary Examiner*—Anatoly Vortman
*Assistant Examiner*—Michael Rutland-Wallis
(74) *Attorney, Agent, or Firm*—Muirhead & Saturnelli, LLC

(57) ABSTRACT

There is provided a second switch used to turn on/off connection between a first circuit portion with a decoupling capacitance on a first switch side. Then, in accordance with on/off of the first switch, the second switch is turned on/off. By performing such switch control, when the first and second switches and are turned off and the first circuit portion shifts to the standby mode, the electric charge stored in the decoupling capacitance in the on state of the first and second switches is held. The electric charge held in the decoupling capacitance contributes to charging of a parasitic capacitance of the first circuit portion when the first and second switches and are again turned on. Therefore, when the first circuit portion shifts from the standby mode to the normal operating mode, the instantaneous voltage drop at a first connection point can be reduced.

9 Claims, 7 Drawing Sheets

SEMICONDUCTOR DEVICE FOR PREVENTING NOISE GENERATION

FIELD OF THE INVENTION

The present invention relates to a semiconductor device, and more particularly to improvement in a semiconductor device having a function to set a built-in circuit portion in a standby mode.

BACKGROUND ART

In principle, in a semiconductor device constituted by a CMOS circuit, a path between a power supply and a GND is interrupted unless there is no change in the status. Therefore, in general, power consumption of the semiconductor device constituted by the CMOS circuit is small.

However, with high integration of the semiconductor device in recent years, a size of an MOS transistor (which will be simply referred to as a "transistor" hereinafter) constituting the CMOS circuit is becoming smaller. Also, there occurs a problem that a sub-threshold characteristic of the transistor is deteriorated and a leakage current disadvantageously flows as the size of the transistor is reduced and a gate length of the same becomes shorter.

Such a leakage current becomes a problem particularly in the semiconductor device having a function to set the built-in circuit portion in the standby mode. Such a semiconductor device is set in the standby mode because the power is wastefully consumed when the leakage current flows regardless of the purpose of further reducing the power consumption.

On the other hand, there is an advantage that the threshold voltage lowers and the operating speed is increased when the size of the transistor is small. There is a demand to keep this advantage even if the purpose is prevention of the leakage current.

In view of the above-described problem, there has been proposed a technique that the circuit portion which demands a fast operating speed is constituted by a transistor with a low threshold voltage, a switch is arranged between the circuit portion and a power supply and the switch is turned off to interrupt the power supply path to the circuit portion when setting in the standby mode.

For example, Japanese patent application laid-open publication No. 48525/1985 discloses a technique that a transistor having a channel length longer than a channel length of a transistor constituting the circuit portion (therefore having a high threshold voltage) is connected as a switch between the circuit portion which is set in the standby mode and the power supply portion. Further, Japanese patent application laid-open publication No. 29834/1994 discloses a technique that a transistor having a high threshold voltage is connected as a switch between a circuit using a transistor with a low threshold voltage and a power supply line and the leakage current can be suppressed while constituting a high-speed circuit. Both of these techniques adopt a high-threshold voltage transistor having a good sub-threshold characteristic as the switch. The leakage current of the high-threshold voltage transistor is far smaller than the leakage current of the low-threshold transistor. Therefore, when the transistor with a high threshold voltage is used, supply of the power to the circuit portion which is in the standby mode is substantially interrupted.

Meanwhile, in this type of semiconductor device, in order to cope with an instantaneous power supply fluctuation in the circuit portion which is in the normal operating mode, a capacitance portion for electric charge supply is connected in parallel with the circuit portion. This capacitance portion is referred to as a decoupling capacitance or a bypass capacitor.

FIG. 1 shows an example of the conventional semiconductor device having both the switch and the decoupling capacitance mentioned above.

Referring to FIG. 1, a semiconductor device 400 has an on-chip power supply terminal 101 connected to an external power supply (not shown) and an on-chip GND terminal 102 connected to an external GND (not shown). Further, the semiconductor device 400 has a first circuit portion 111, a switch 113 and a second circuit portion 120.

The first circuit portion 111 is constituted by a transistor with a low threshold voltage. A decoupling capacitance 114 is connected to the first circuit portion 111 in parallel. The switch 113 consists of a pMOS transistor with a high threshold voltage, and is connected to a connector between the first circuit portion 111 and the decoupling capacitance 114.

The second circuit portion 120 is constituted by, e.g., a transistor with a high threshold voltage, constantly receives supply of power, and never enters the standby mode. The second circuit portion 120 includes a control circuit 121 used to control the switch 113. The control circuit 121 generates a control signal 123 and controls the switch 113. As described above, the switch 113 is a pMOS transistor, and the control signal 123 is supplied to a gate of this pMOS transistor. When the control signal 123 is on a low level, the switch 113 is turned on.

When the first circuit portion 111 enters the standby mode, the switch 113 is turned off, and supply of power to the first circuit portion 111 is stopped.

Meanwhile, in the prior art semiconductor device mentioned above, when the first circuit portion 111 returns from the standby mode and shifts to the regular operating mode, various problems occur. For example, as shown in FIG. 2, immediately after the first circuit portion 111 returns to the operating mode from the standby mode, a temporal sudden drop 150 in a potential at the on-chip power supply terminal 101 (first connection point 131) occurs. Such problems will now be described in detail.

As shown in FIG. 1, the first circuit portion 111 and the second circuit portion 120 generally hav certain degrees of parasitic capacitances 112 and 122, respectively. When the switch 113 is in the on state, the parasitic capacitances 112 and 122 are charged together with the decoupling capacitance 114.

Here, when the switch 113 is turned off, the electric charges stored in the parasitic capacitance 112 of the first circuit portion 111 and the decoupling capacitance 114 are consumed as a leakage current of the first circuit portion 111. On the other hand, the parasitic capacitance 122 of the second circuit portion 120 is still stored. As a result, immediately before turning on the switch 113, only the parasitic capacitance 122 of the second circuit portion 120 stores the electric charge. When the switch 113 is turned on in this state, the electric charge stored in the parasitic capacitance 122 is redistributed between the parasitic capacitances 112 and 122 and the decoupling capacitance 114 until the balanced state is obtained. As a result, the potential of the on-chip power supply terminal 101 (first connection point 131) temporarily suddenly drops as described above (as denoted by reference character 150 in FIG. 2).

Furthermore, when the potential of the on-chip power supply terminal 101 (first connection point 131) is lowered, a transient current tries to flow through the semiconductor device 400 from the external power supply. At this moment, a bonding wire, a printed wiring or the like interposed between the on-chip power supply terminal 101 and the external power supply functions as a parasitic inductance L, and has an impedance of jωL when the transient current flows. Since this impedance jωL is an obstacle of smooth supply of the electric charge from the external power supply to the on-chip power supply terminal 101, it takes some time until the potential of the on-chip power supply terminal 111 or the like is stabilized.

Moreover, since the parasitic inductance and the parasitic capacitance constitute one type of LCR circuit, they may possibly oscillate. This oscillation may possibly cause a problem that it becomes a power supply noise and provokes the malfunction of any other non-illustrated circuit included in the semiconductor device 400.

It is an object of the present invention to solve the above-described problems in the prior art semiconductor device and provide a semiconductor device which can suppress a power supply noise generated when returning from the standby mode.

DISCLOSURE OF THE INVENTION

According to the present invention, in order to solve the above-described problems, there is provided a second switch (115) which turns on/off connection between a circuit portion (first circuit portion) (111) and a capacitance portion (decoupling capacitance) (114) on a side of a first switch (113) which is controlled in connection with the state of the circuit portion (111). In addition, the second switch (115) is turned on/off in accordance with on/off of the first switch (113).

By performing such switch control, the second switch (115) is also turned on when the first switch (113) is in the on state, and the capacitance portion (114) is charged. Thereafter, when the first switch (113) is turned off, the second switch (115) is also turned off, and the electric charge stored in the capacitance portion (114) is held. Additionally, when the circuit portion (111) returns to the operating mode from the standby mode, the first switch (113) is again turned on, and the second switch (115) is likewise again turned on. Then, charging of the parasitic capacitance (112) included in the circuit portion (111) can be performed by the electric charge held in the capacitance portion (114). As a result, an instantaneous voltage drop in the on-chip power supply terminal (101) which is a problem in the conventional semiconductor device (400) is greatly reduced.

Specifically, according to the present invention, there is provided the following semiconductor device.

That is, according to the present invention, there is provided a semiconductor device (100) as a first semiconductor device, comprising: first and second power supply terminals (102 and 101 in FIG. 4, and 101 and 102 in FIG. 7); a first circuit portion (111) which has first and second connection ends (135 and 134 in FIG. 4, and 134 and 135 in FIG. 7), the first connection end (135 in FIG. 1, and 134 in FIG. 7) being connected to the first power supply terminal (102 in FIG. 1, and 101 in FIG. 7); a first switch (113 and 113a) connected between the second power supply terminal (101 in FIG. 1, and 102 in FIG. 7) and the second connection end (134 in FIG. 1, and 135 in FIG. 7) in order to turn on/off electrical connection between the second power supply terminal (101 in FIG. 1, and 102 in FIG. 7) and the second connection end (134 in FIG. 1, and 135 in FIG. 7); and a capacitance portion (114) connected between the first connection end (135 in FIG. 1, and 134 in FIG. 7) and the second connection end (134 in FIG. 1, and 135 in FIG. 7) so as to be connected to the first circuit portion (111) in parallel, wherein the semiconductor device includes a second switch (115 and 115a) connected between the circuit portion (111) and the capacitance portion (114) on the first switch (113 and 113a) side in order to substantially match connection between the circuit portion (111) and the capacitance portion (114) on the first switch (113 and 113a) side with on/off of the first switch (113 and 113a) and turn on/off this connection.

Further, according to the present invention, in the first semiconductor device, there is provided a semiconductor device as a second semiconductor device further comprising a second circuit portion (120) connected between the first power supply terminal (102 in FIG. 1, and 101 in FIG. 7) and the second power supply terminal (101 in FIG. 1, and 102 in FIG. 7) and also connected to both the first switch (113 and 113a) and the second switch (115 and 115a) in order to turn on/off both the first switch (113 and 113a) and the second switch (115 and 115a).

Furthermore, according to the present invention, in the first semiconductor device, there is provided a semiconductor device as a third semiconductor device, wherein one of the first and second power supply terminals (102 and 101) is used as an on-chip power supply terminal (101) connected to an external power supply and the other one is used as an on-chip GND terminal (102) which is grounded.

Moreover, according to the present invention, in the third semiconductor device, there is provided a semiconductor device as a fourth semiconductor device, wherein the second power supply terminal (101 in FIG. 1) is used as the on-chip power supply terminal, and each of the first switch (113) and the second switch (115) consists of a pMOS transistor.

In addition, according to the present invention, in the third semiconductor device, there is provided a semiconductor device as a fifth semiconductor device, wherein the first power supply terminal (101 in FIG. 7) is used as the on-chip power supply terminal, and each of the first switch (113a) and the second switch (115a) consists of an nMOS transistor.

Additionally, according to the present invention, in the first semiconductor device, there is provided a semiconductor device as a sixth semiconductor device, wherein the first circuit portion (111) has a parasitic capacitance (112) and a capacitance value of the capacitance portion (114) is larger than the capacitance value of the parasitic capacitance (112).

Further, according to the present invention, in the first semiconductor device, there is provided a semiconductor device as a seventh semiconductor device, wherein the first switch (113 and 113a) and the second switch (115 and 115a) respectively have a first on resistance and a second on resistance, and the first on resistance is larger than the second on resistance.

Furthermore, according to the present invention, in the first semiconductor device, there is provided a semiconductor device as an eight semiconductor device, further comprising a plurality of blocks 110 each consisting of the first circuit portion (111), the capacitance portion (114) and the first and second switches (113 or 113a, and 115 or 115a).

Moreover, according to the present invention, there is provided a method for preventing generation of a noise in a semiconductor device which includes: a circuit portion (111) having an operating mode and a standby mode; a first switch (113, 113a) which is connected to the circuit portion (111) in series and turns on/off electrical connection between the circuit portion (111) and a power supply (103); and a capacitance portion (114) which is connected to the circuit portion (111) in parallel and used to absorb an instantaneous voltage fluctuation of the power supply (103), the first switch (113, 113a) being turned on when the circuit portion (111) is in the operating mode, and the first switch (113, 113a) being turned off when the circuit portion (111) is in the standby mode, the method comprising the steps of: providing a second switch (115, 115a) between the circuit portion (111) and the capacitance portion (114) on the first switch (113, 113a) side; turning on the second switch (115, 115a) and charging the capacitance portion (114) when the first switch (113, 113a) is in the on state; turning off the second switch (115, 115a), disconnecting the capacitance portion (114) from the circuit portion (111) by turning off the second switch (115, 115a) and holding the electric charge stored in the capacitance portion (114) when the first switch (113, 113a) is in the off state; and discharging the electric charge stored in the capacitance portion (114) and supplying it to the circuit portion (111) by turning on the second switch (115, 115a) in order to prevent occurrence of a noise, and then again charging the capacitance portion (114) when the first switch (113, 113a) is changed from the off state to the on state.

BEST MODE FOR CARRYING OUT THE INVENTION

A semiconductor device and a noise generation preventing method thereof will now be described hereinafter in detail with reference to the accompanying drawings.

First Embodiment

Figure 1:
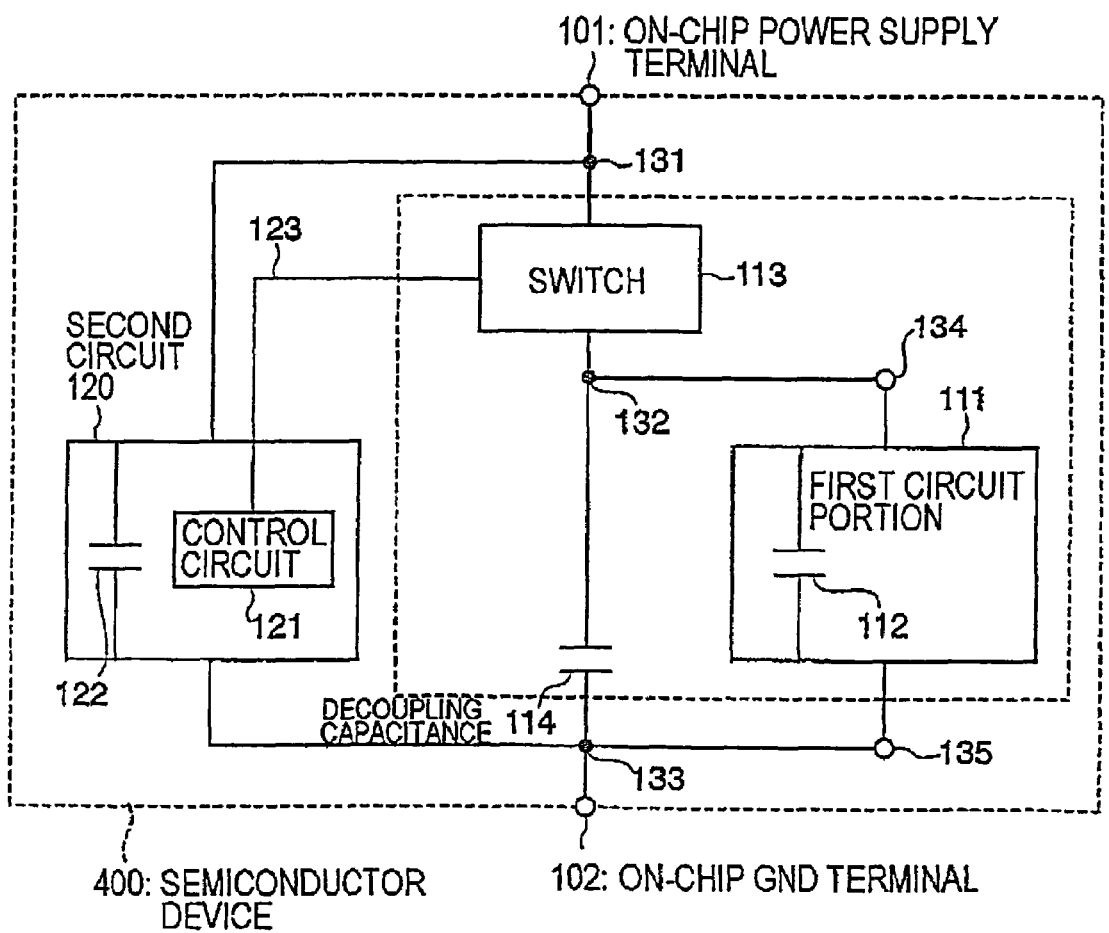
FIG. 1 is a circuit diagram of a prior art semiconductor device.
Figure 2:
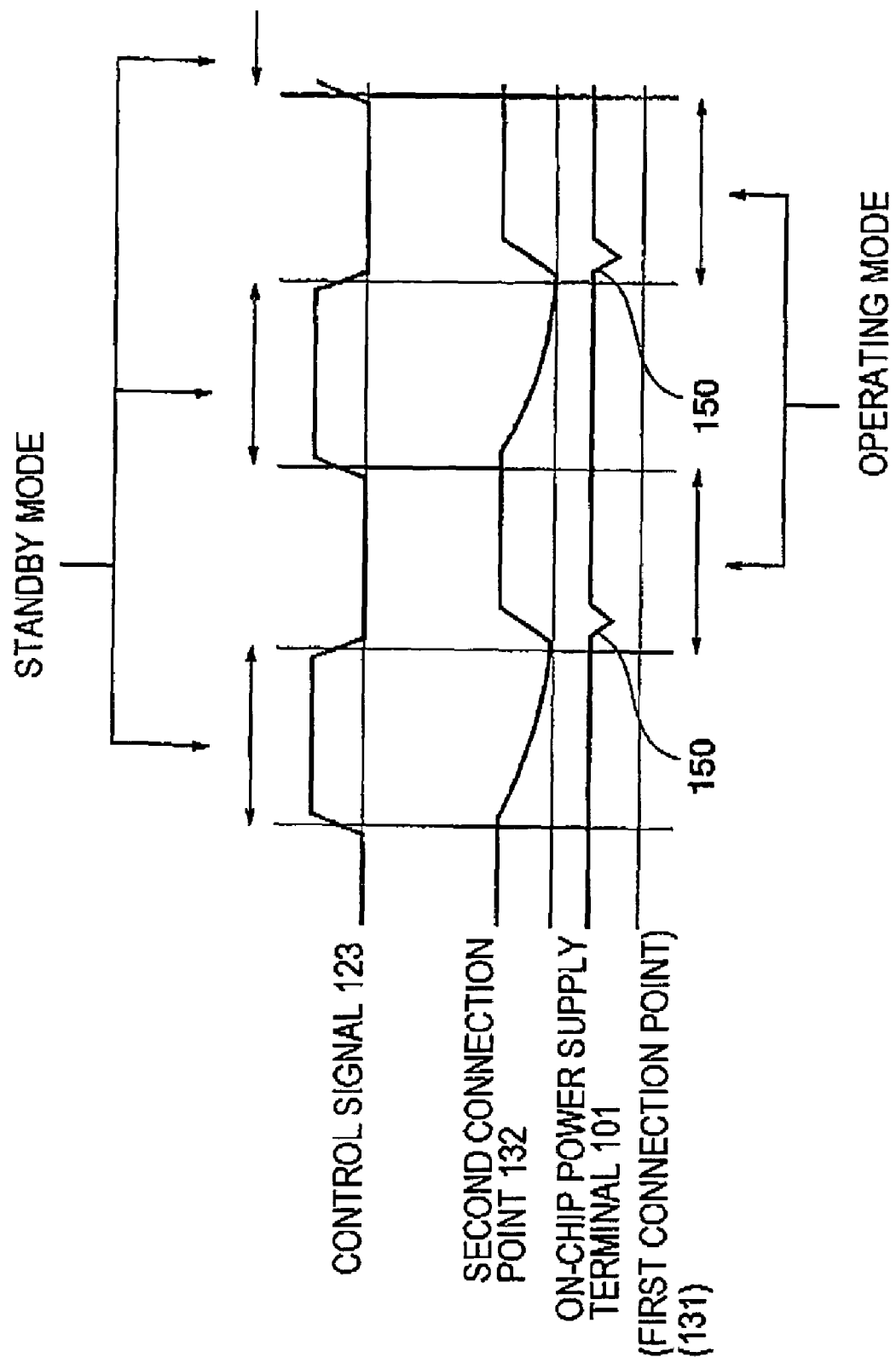
FIG. 2 is a time chart showing a potential change of each part in the semiconductor device illustrated in FIG. 1.
Figure 3:
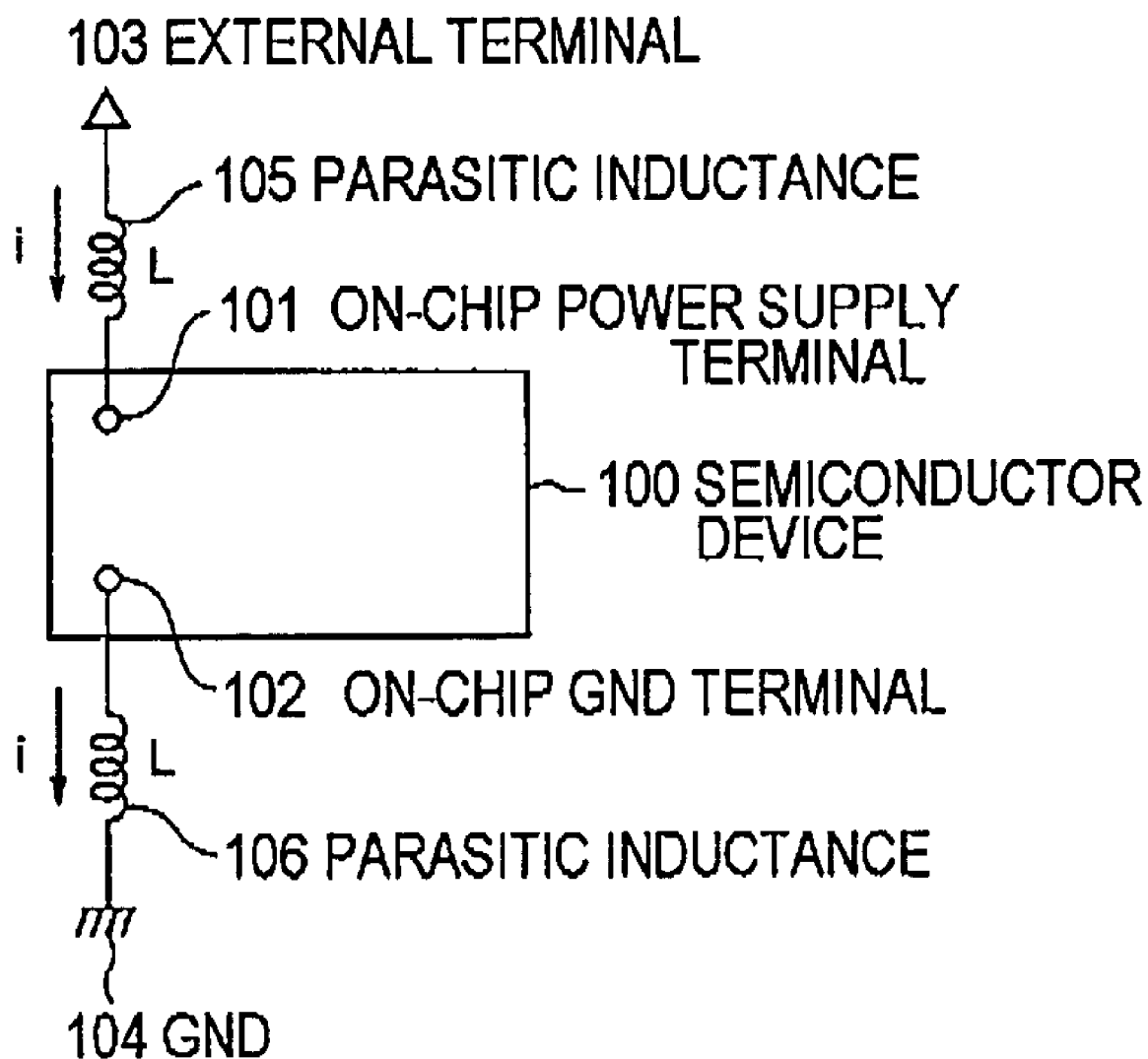
FIG. 3 is a view showing the relationship between the semiconductor device according to a first embodiment of the present invention, an external power supply and a GND.

Referring to FIG. 3, a semiconductor device 100 according to a first embodiment of the present invention includes two terminals, i.e., an on-chip power supply terminal 101 and an on-chip GND terminal 102. In this embodiment, the semiconductor device 100 is provided in the form of a semiconductor chip. Therefore, the on-chip power supply terminal 101 and the on-chip GND terminal 102 take the form of a power supply electrode pad and a GND electrode pad. Such a semiconductor device 100 has a power supply line and a GND line being pulled to the outside by wire bonding or the like and packaged. In use, an external power supply 103 and a GND 104 are connected to these pulled-out lines. At this moment, a bonding wire, a printed wiring or the like constituting the lines has parasitic inductances 105 and 106. In FIG. 3, therefore, connection between the external power supply 103 and the on-chip power supply terminal 101 is indicated by the parasitic inductance 105, and connection between the GND 104 and the on-chip GND terminal 102 is indicated by the parasitic inductance 106.

Figure 4:
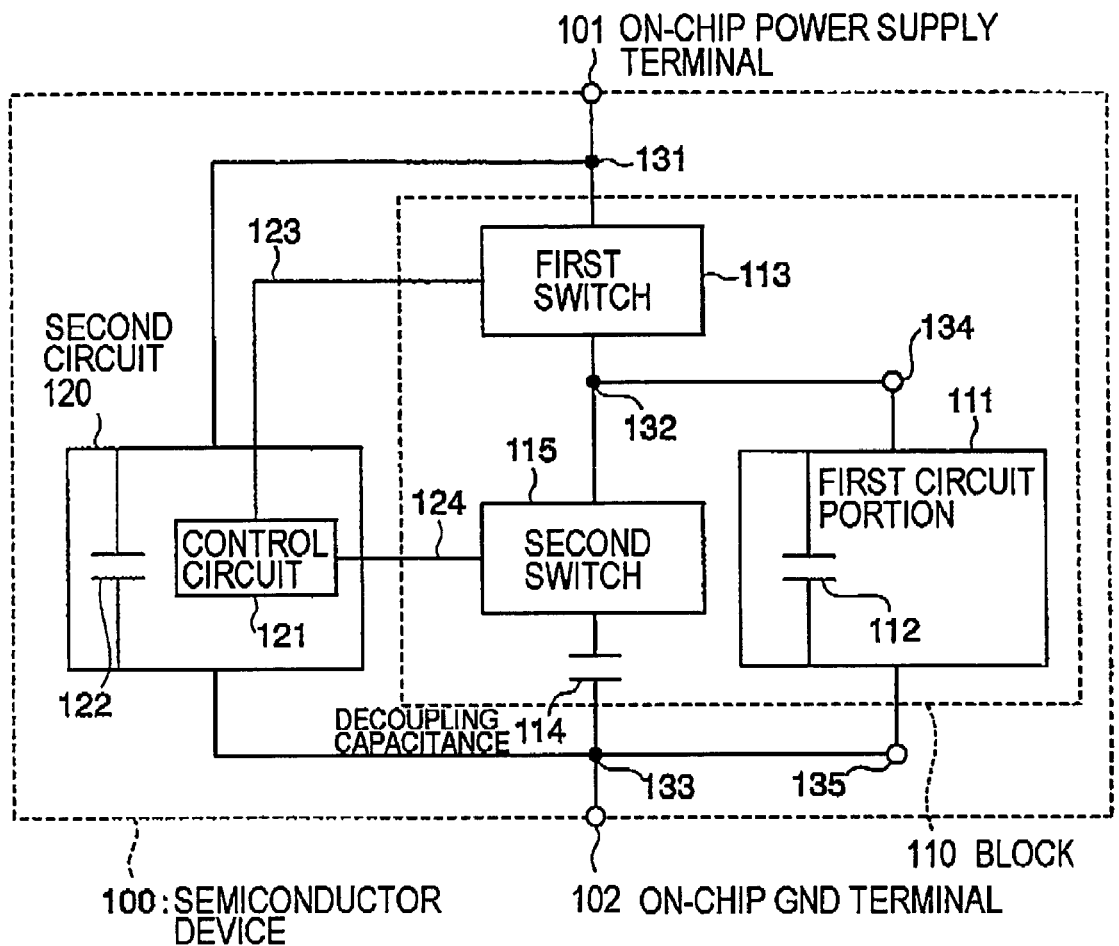
FIG. 4 is a circuit diagram of the semiconductor device according to the first embodiment of the present invention.

In detail, the semiconductor device 100 is constituted as shown in FIG. 4. That is, the semiconductor device 100 has a first circuit portion 111, a second circuit portion 120, a first switch 113, a second switch 115, and a decoupling capacitance 114. In these members, a part constituted by the first circuit portion 111, the first switch 113, the second switch 115 and the decoupling capacitance is referred to as a block 110 for the convenience's sake.

The first switch 113 is connected between a first connection point 131 and a second connection point 132. The first circuit portion 111 has a pair of connection ends 134 and 135, and one connection end 134 is connected to the second connection point 132 while the other connection end 135 is connected to a third connection point 133. That is, the first switch 113 and the first circuit portion 111 are connected in series between the on-chip power supply terminal 101 and the on-chip GND terminal 102. This first switch 113 connects/disconnects a power supply path as apparent from the connection relationship, and it is also called a power supply switch.

A circuit obtained by connecting the second switch 115 and the decoupling capacitance 114 in series is connected between the second connection point 132 and the third connection point 133. Here, the second switch 115 is connected to the second connection point, and the decoupling capacitance 114 is connected to the third connection point, respectively. That is, the second switch 115 is provided on the first switch 113 side of the decoupling capacitance 114. In other words, as to connection between the first circuit portion 111 and the decoupling capacitance 114, the second switch 115 is provided at a position where it can turn on/off connection on the first switch 113 side. Since this second switch changes over charge/discharge and storage of the electric charge in the decoupling capacitance 114, it is also referred to as a capacitance switch.

The second circuit portion 120 is connected between the first connection point 131 and the third connection point 133, and includes a control circuit 121 used to control the first and second switchs 113 and 115. In detail, the control circuit 121 inputs a first control signal 123 to the first switch 113, and inputs a second control signal 124 to the second switch 115, thereby performing switch control.

Figure 5:
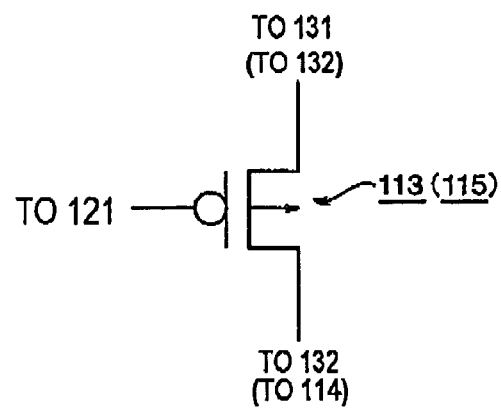
FIG. 5 is a view showing a concrete structure of a switch used in the semiconductor device depicted in FIG. 1.

In this embodiment, the first and second switches 113 and 115 are constituted by pMOS transistors as shown in FIG. 5. Therefore, the first and second control signals 123 and 124 indicate a low level when the first and second switches 113 and 115 are to be turned on, and indicate a high level when the first and second switches 113 and 115 are to be turned off. It is to be noted that the structure (a gate length, a quantity of ion implantation, a gate insulating film thickness and others) of the pMOS transistor and the control signal level are selected/designed in such a manner that a off-leakage current (off-leakage current also including a gate insulating film leakage current) is minimized.

Figure 6:
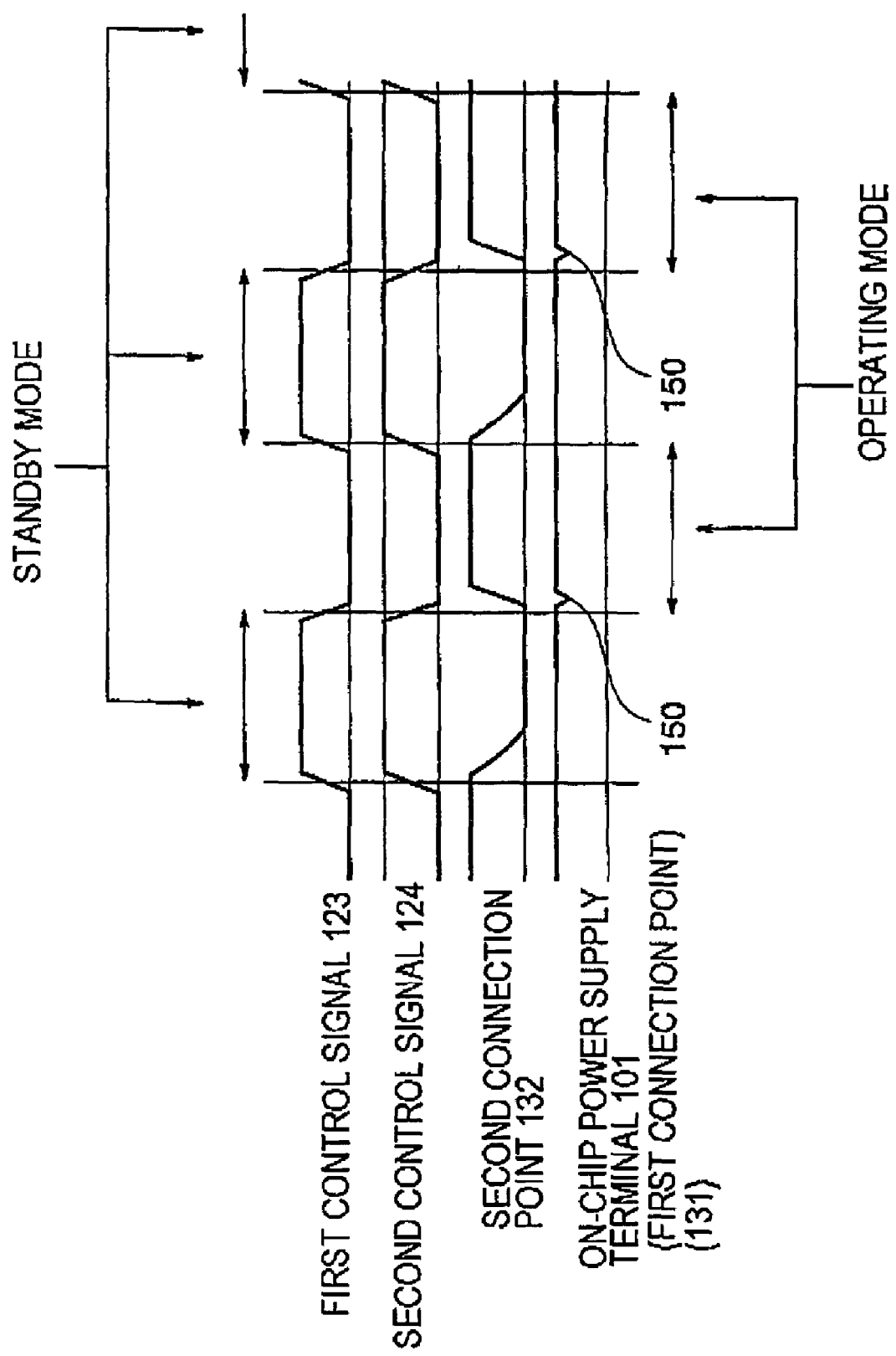
FIG. 6 is a time chart showing a potential change of each part of the semiconductor device depicted in FIG. 1.

The operation of the semiconductor device 100 having the above-described structure will now be described in detail with reference to a timing chart of FIG. 6. Incidentally, it is assumed that the first circuit portion 111 and the second circuit portion 120 likewise have the parasitic capacitances 112 and 122 respectively in the semiconductor device 100 according to this embodiment.

As described above, in this embodiment, since both the first and second switches 113 and 115 are constituted by pMOS transistors, each switch is turned off when the control signal is on the high level, and it is turned on when the control signal is on the low level. Moreover, the both switches 113 and 115 are in the on state before entering the standby mode, and the parasitic capacitances 112 and 122 and the decoupling capacitance 114 are charged at this moment.

When both the first and second control signals 123 and 124 rise to the high level in this state, the first and second switches 113 and 115 are both turned off. As a result, the electric charge stored in the parasitic capacitance 112 is discharged as a leakage current of a transistor constituting the first circuit portion 111 (see a level drop at the second connection point in FIG. 6). On the other hand, since the electric charge stored in the decoupling capacitance 114 is held until the second switch 115 is turned on because the current path to the first circuit portion 111 side is interrupted by the second switch 115. It is to be noted that the second switch 120 keeps receiving power irrespective of the first switch 113 and hence a quantity of the electric charge in the parasitic capacitance 122 does not vary by turning off the first switch. This can be understood from the fact that the level of the on-chip power supply terminal 101 (first connection point 131) is maintained constant irrespective of turning off of the first switch 113 in FIG. 6.

Then, when the first and second control signals 123 and 124 fall to the low level and the first and second switches 113 and 115 are turned on, the first circuit portion 111 shifts to the operating mode from the standby mode. At this moment, like the prior art semiconductor device, the electric charge is again distributed between the parasitic capacitances 112 and 122 and the decoupling capacitance 114.

Here, a difference between the semiconductor device according to this embodiment and the prior art semiconductor device lies in a total quantity of the electric charge to be redistributed between the parasitic capacitances 112 and 122 and the decoupling capacitance 114. Although a total quantity of the electric charge to be redistributed is a quantity of the electric charge stored in the parasitic capacitance 122 in the prior art semiconductor device, a total quantity of the electric charge to be redistributed is a sum of a quantity of the electric charge in the parasitic capacitance 122 and a quantity of the electric charge in the decoupling capacitance 114 since the decoupling capacitance 114 holds the electric charge in the semiconductor device according to this embodiment. Therefore, even if the electric charge is redistributed between the capacitances 112, 122 and 114, a voltage drop at the first connection point 131 is greatly minimized as compared with the prior art semiconductor device.

In addition, a potential difference is generated between the external power supply 103 and the on-chip power supply terminal 101 due to a voltage drop at the first connection point 131, and a transient current tries to flow. At this moment, the parasitic inductance 105 functions as an impedance, but the potential difference itself is small, and hence the time required for supply of the electric charge from the outside is reduced as compared with the prior art semiconductor device. As shown in FIG. 6, therefore, the level rising of the second connection point 132 is steep as compared with the conventional semiconductor device.

Additionally, in regard to redistribution of the electric charge, changing the view point, it can be understood that movement of the electric charge into the block 110 from the outside of the block 110 is also reduced. That is, since supply of the electric charge to the parasitic capacitance 112 of the first circuit portion 111 can be performed to some degree in the block 110, the power supply noise is reduced. In order to make this advantage more prominent, a capacitance value of the decoupling capacitance 114 may be set larger than a capacitance value of the parasitic capacitance 112 of the first circuit portion 111. The advantage of the power supply noise reduction becomes more prominent without taking supply of the electric charge from the parasitic capacitance 122 of the second circuit portion 120 or the outside of the chip into consideration as the decoupling capacitance 114 is larger.

Further, in this embodiment, the electric charge of the decoupling capacitance 114, which is consumed as the leakage current in the first circuit portion 111 when the first switch 113 is turned off in the prior art, is held as described above. This means that the leakage current in the first circuit portion 111 when the switch 113 is in the off state can be reduced. That is, as compared with the prior art semiconductor device, the semiconductor device according to this embodiment achieves the lower power consumption.

It is to be noted that the switching control is carried out in such a manner that the first switch 113 and the second switch 115 are simultaneously turned on/off in the above-described embodiment but a time difference may be given to such control if this time difference is small.

Furthermore, if the on resistance of the first switch 113 is set large to some degree, the peak of the noise propagated from the block 110 to the outside can be suppressed. Moreover, by adopting such a structure, the oscillation condition when the power supply system is regarded as an LCR circuit is not satisfied, thereby avoiding the oscillation.

On the other hand, when the on resistance of the second switch 115 is large, supply of the electric charge from the decoupling capacitance 114 is prevented, and the advantage of the present invention is reduced. It is, therefore, preferable that this on resistance is small. In particular, referring to the relationship with the first switch 113, it is desirable that the on resistance of the second switch 115 is not more than the on resistance of the first switch 113 in order to suppress propagation of the pow r supply noise of the block 110 to the outside of the block 110.

Second Embodiment

The semiconductor device 100 according to the second embodiment of the present invention is a modification of the semiconductor device according to the first embodiment mentioned above. Its structure is as shown in FIG. 7.

Figure 7:
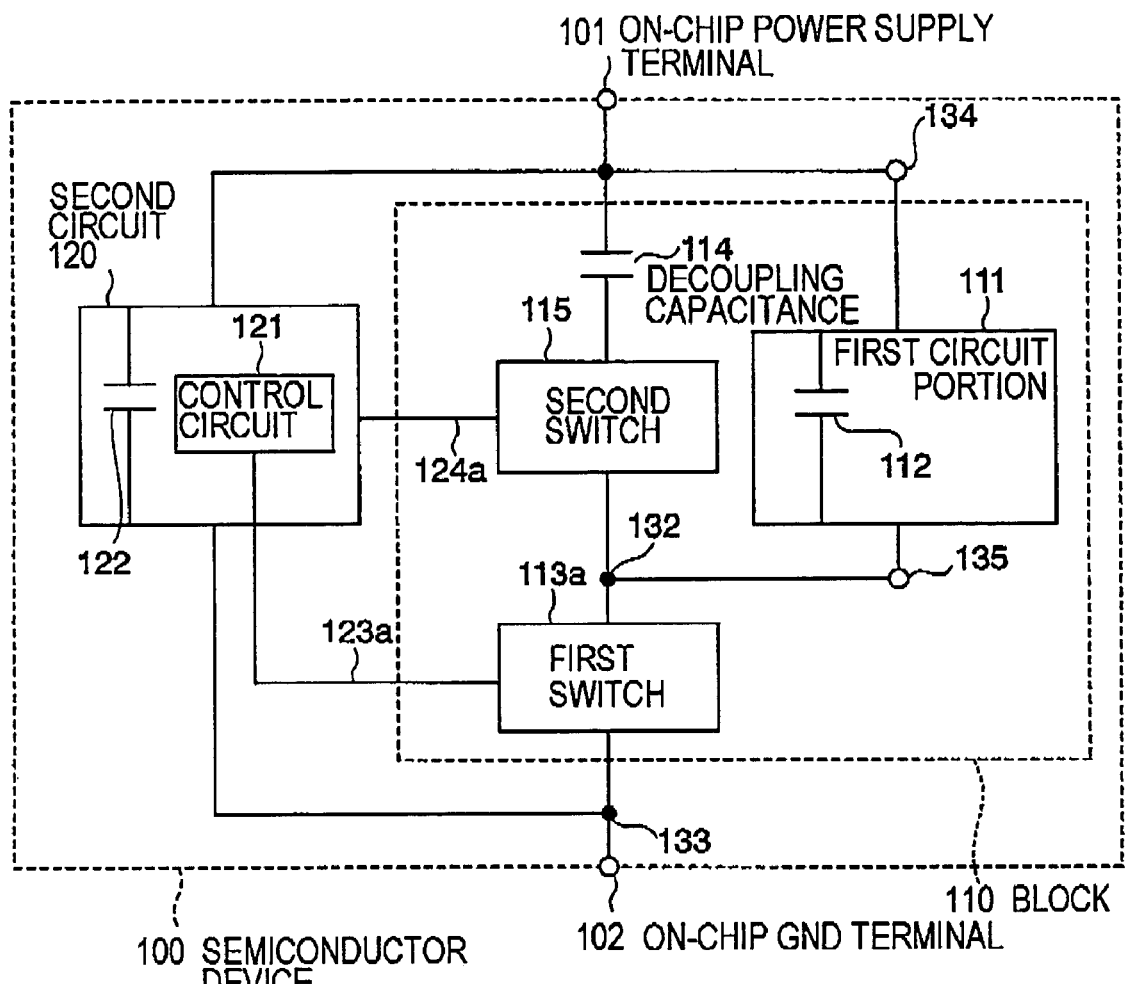
FIG. 7 is a circuit diagram of a semiconductor device according to a second embodiment of the present invention.
Figure 8:
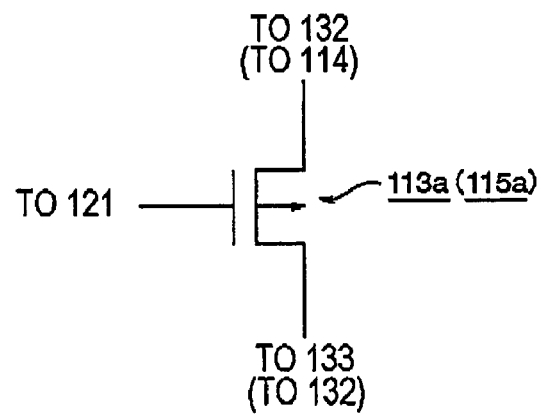
FIG. 8 is a view showing a concrete structure of a switch used in the semiconductor device depicted in FIG. 7.

In FIG. 7, the first switch 113a is provided on the GND side of the first circuit portion 111, and the second switch 115a is provided on the first switch 113a side, namely, the GND side of the decoupling capacitance 114. Moreover, in this embodiment, as the first and second switches 113a and 115a, nMOS transistors shown in FIG. 6 are adopted. As a result, the first and second control signals 123a and 124a take the high level when the first and second switches 113a and 115a are turned on, and they take the low level when the first and second switches 113a and 115a are turned off.

Such a change in switch arrangement is particularly useful when the nMOS transistor is used as a switch element. When the nMOS transistor is adopted as the first switch according to the first embodiment, the upper limit of the potential at the second connection point 132 is restricted (so-called "Vth drop" occurs) from the relationship between a gate-source voltage VGS and a threshold voltage Vth. However, when the switches are arranged as in this embodiment, the restriction is not produced even if the nMOS transistor is used. In addition, as well known, the switch consisting of the nMOS transistor has a larger driving capability than the switch consisting of the pMOS transistor. In other words, by using the nMOS transistor as the switch, the switch size can be reduced.

As described above, according to the invention of this application, since the additional switch which can interrupt connection so as to hold the electric charge in the decoupling capacitance in the standby mode is provided, it is possible to reduce the power supply noise generation at the time of electric charge redistribution when shifting from the standby mode to the regular operating mode.

It is to be noted that the first circuit portion 111 and the second circuit portion 120 are abstract in the first and second embodiments according to the present invention for the convenience's sake. As apparent from Japanese patent application laid-open publication No. 48525/1985, the first circuit portion 111 is, e.g., a CPU and the second circuit portion is, e.g., a RAM or any other circuit. That is, the first circuit portion 111 is expected to operate at a relatively high speed, constituted by a transistor with a low threshold voltage, and an object of the standby mode. On the other hand, the second circuit portion 120 is constantly connected between the on-chip power supply terminal 101 and the on-chip GND terminal 102, and does not require such a specification as needed in the first circuit portion 111.

Although the present invention has been described based on some embodiments, the present invention is not restricted thereto.

Figure 9:
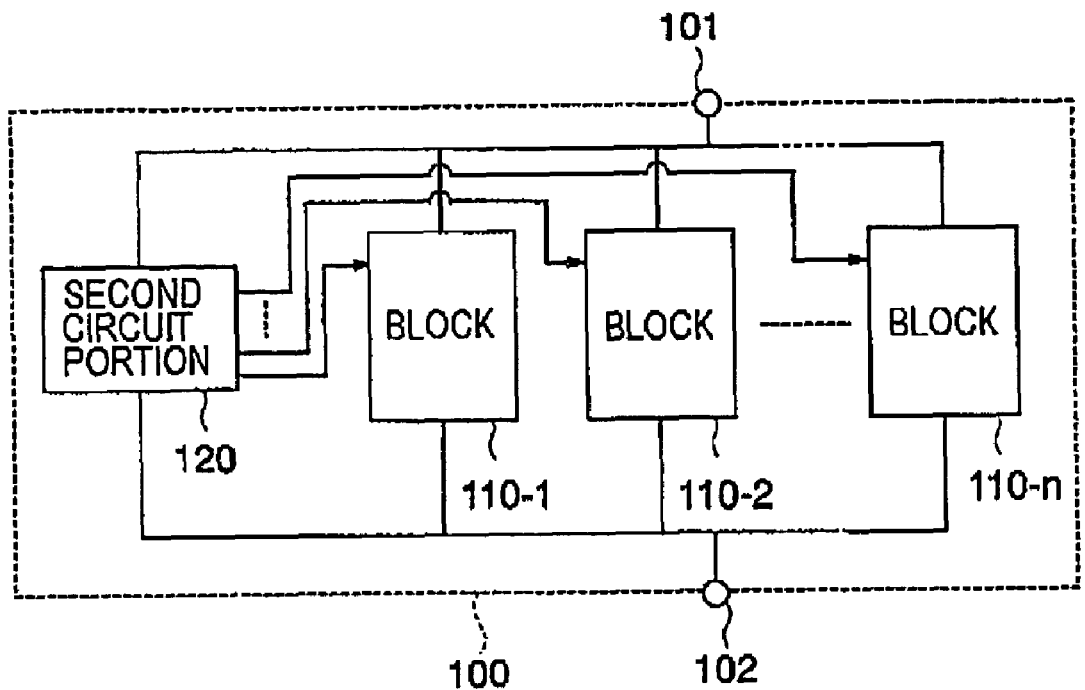
FIG. 9 is a circuit diagram of a semiconductor device according to another embodiment of the present invention.
Figure 10:
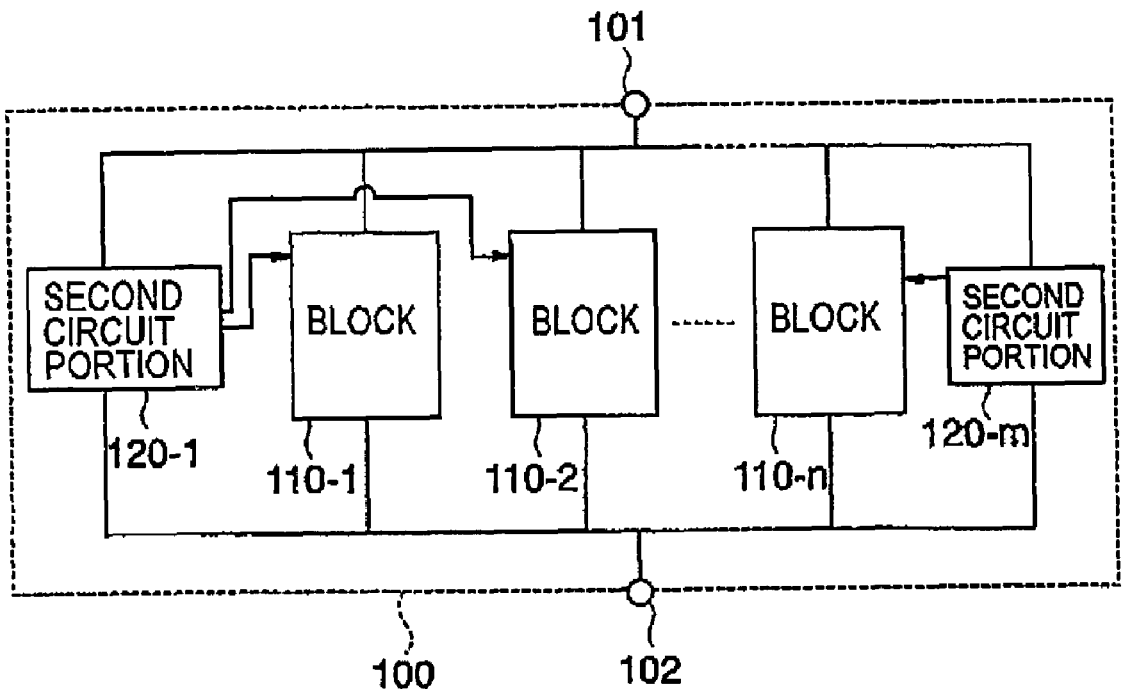
FIG. 10 is a circuit diagram of a semiconductor device according to still another embodiment of the present invention.

For example, the numerical relationship between the block 110 including the first circuit portion 111 and others and the second circuit portion 120 does not have to be necessarily the one-to-one relationship. As shown in FIG. 9, n blocks 110-1 to 110-n may be connected to one second circuit portion 120 in parallel, and the n blocks 110-1 to 110-n may be subjected to switch control by control signals from the control circuit 121 included in the second circuit portion 120. Further, as shown in FIG. 10, m second circuit portions 120-1 to 120-m and n blocks 110-1 to 110-n may be connected in parallel. In this case, the m second circuit portions 120-1 to 120-m transmit the control signal to the predetermined number of blocks 110 respectively, and switch control is carried out. When a plurality of blocks are provided in this manner, in addition to the above-described advantage, the influence of the noise to the other blocks in the normal operation can be reduced when one block shifts to the operating mode from the standby mode.

Furthermore, in the above-described embodiment, two transistor switches having different polarities may be used to each of the first and second switches. In this case, taking the characteristic of each switch into consideration, arrangements must be made so as not to generate a phenomenon such as a Vth drop. Moreover, the first switch and the second switch may be constituted by transistors having polarities different from each other. In addition, the second switch may be provided at any position as long as it is a position which can prevent the electric charge stored in the decoupling capacitance from being consumed as the leakage current in the first circuit portion in the standby mode. For example, the second switch may be provided between the first circuit portion and the first switch (that is, between the connection end 134 and the second connection end 132) in order to turn on/off connection between the first circuit portion and the decoupling capacitance on the first switch side. Even in this case, if the second switch is also turned off when the first switch is turned off, the electric charge stored in the decoupling capacitance is held without flowing out, and the same advantages as those in the foregoing embodiments can be obtained.

The invention claimed is:

1. A semiconductor device, comprising:
   first and second power supply terminals;
   a first switch connected to said first power supply terminal;
   a circuit portion connected between said first switch and said second power supply terminal;
   a second switch connected to a first point between said first switch and said circuit portion; and
   a capacitance portion serially connected between said second switch and a second point between said circuit portion and said second power supply terminal, wherein said first switch controls on/off of an electrical connection between said first power supply terminal and said circuit portion and wherein said second switch turns on/off controlled in accordance with on/off operation of said first switch.

2. The semiconductor device according to claim 1, further comprising a second circuit portion which is connected between the first power supply terminal and the second power supply terminal and also connected to the first switch and the second switch in order to turn on/off both the first switch and the second switch.

3. The semiconductor device according to claim 1, wherein one of the first and second power supply terminals is also used as an on-chip power supply terminal connected to an external power supply, and the other one is used as an on-chip GND terminal which is grounded.

4. The semiconductor device according to claim 3, wherein the second power supply terminal is used as the on-chip power supply terminal and each of the first switch and the second switch consists of a pMOS transistor.

5. The semiconductor device according to claim 3, wherein the first power supply terminal is used as the on-chip power supply terminal and each of the first switch and the second switch consists of an nMOS transistor.

6. The semiconductor device according to claim 1, wherein the first circuit portion has a parasitic capacitance and a capacitance value of the capacitance portion is larger than a capacitance value of the parasitic capacitance.

7. The semiconductor device according to claim 1, wherein the first switch and the second switch respectively have a first on resistance and a second on resistance and the first on resistance is larger than the second on resistance.

8. The semiconductor device according to claim 1, further comprising a plurality of blocks each consisting of the first circuit portion, the capacitance portion and the first and second switches.

9. A controlling method of a semiconductor device which includes: first and second power supply terminals, a first switch connected to said first power supply terminal, a circuit portion connected between said first switch and said second power supply terminal; a second switch connected to a first point between said first switch and said circuit portion; and a capacitance portion connected between said second switch and a second point between said circuit portion and said second power supply terminal, the method comprising the steps of:

turning on the second switch and charging the capacitance portion when the first switch is in the on state;

turning off the second switch, disconnecting the capacitance portion from the circuit portion, and holding the electric charge stored in the capacitance portion when the first switch is in the off state; and discharging the electric charge stored in the capacitance portion by turning on the second switch, supplying the electric charge to the circuit portion and charging the capacitance portion when the first switch is changed from the off state to the on state.

* * * * *